ELECTRIC ACCUMULATOR CELLS

Filed July 12, 1962

Inventor
WILLIAM H. WILKINSON

By Imrie and Smiley
Attorneys

TUNNEL DIODE AND PROCESS THEREFOR

Filed April 19, 1961 2 Sheets-Sheet 2

United States Patent Office 3,207,635
Patented Sept. 21, 1965

3,207,635
TUNNEL DIODE AND PROCESS THEREFOR

Paul L. Baron, Owego, Ubert Cocca, Apalachin, and Raymond W. Hamaker, Barton, N.Y., assignors to International Business Machines Corporation, New York, N.Y., a corporation of New York Filed Apr. 19, 1961, Ser. No. 104,054
6 Claims. (Cl. 148—1.5)

This invention relates to tunnel diode junctions and more particularly to a novel tunnel diode and process therefor.

It is well known that a tunnel diode is a semiconductor diode which has a narrow junction and in which the semiconductor host is degeneratively doped with opposite type impurity elements.

The following are requirements for a tunnel diode junction: The P-N junction must be narrower at the interface, i.e., the junction width is a few hundred angstrom units, in comparison with the normal P-N junction width of several thousand angstrom units. Both P-type and N-type regions must be degenerate, i.e., the Fermi level is within the conduction band of the N-type region and is within the valence band of the P-type region.

The concentration of the electron carriers from the N-type dopant in the N region of the junction and the concentration of available states from the P-type dopant in the P region of the junction are large. When the junction is forward biased, a significant portion of the forward current occurs by quantum-mechanical tunneling of the charge carriers to the available states. The current versus voltage characteristic of a tunnel diode has a negative resistance region produced by this primary tunneling current.

The tunnel diode is particularly advantageous for extremely high frequency oscillatory circuit applications because of the negative resistance region. The tunnel diode is particularly advantageous for switching circuit applications since it has two stable operating points which can be caused to interchange rapidly. The interchange is a quantum-mechanical phenomenon so the speed therefor is theoretically limited only by the speed of light. The tunnel diode is particularly advantageous for circuit applications in the presence of nuclear radiation.

Heretofore, it has been difficult to control the dissolution of the semiconductor host during the alloying phase of tunnel diode junction formation; it has been difficult to fabricate reproducibly a tunnel diode junction; it has been difficult to establish controllably the tunnel diode junction width.

The principal object of this invention is to provide a novel tunnel diode and process therefor.

Another object of this invention is to provide a process for fabricating reproducibly a tunnel diode.

A further object of this invention is to provide a tunnel diode having high peak-to-valley current ratio and high current density.

An additional object of this invention is to provide a process for fabricating a tunnel diode in which the junction width and amount of dopant are controllable.

Another object of this invention is to utilize a metallic carrier for a dopant to control the dissolution of the solidus tunnel diode semiconductor host in the liquidus.

A further object of this invention is to control the tunnel junction width and amount of degenerate doping of the semiconductor host by controlling the temperature of the solidus-liquidus interface during dissolution and recrystallization of the semiconductor host.

The foregoing and other objects, features and advantages of the invention will be apparent from the following more particular description thereof, as illustrated in the accompanying drawings.

In the drawings:

FIGURE 1*a* illustrates a circuit symbol for the tunnel diode.

FIGURE 1*b* is a graph of the forward current I versus forward voltage V for an illustrative tunnel diode.

This invention provides a novel tunnel diode junction and a process therefor. Generally, the process includes the use of a metallic carrier with a dopant for a semiconductor host; dissolution of the semiconductor host by the carrier-dopant alloy which is accomplished by wetting of the solidus-liquidus interface; rapidly heating the interface above the wetting temperature; and cooling of the interface to establish a narrow junction and degenerate doping in the semiconductor which is accomplished by rapidly cooling the interface immediately after it has been heated rapidly. Through the practice of the process, the junction width of a tunnel diode in accordance therewith and the dopant concentration in the regrowth layer of the semiconductor are controlled.

For the particular tunnel diode described herein, the junction is established in N-type germanium host with aluminum as the P-type dopant. For the particular process described herein the dopant is aluminum, the semiconductor host is N-type germanium, and the carrier-dopant alloy is aluminum-tin.

The tunnel diode is a semiconductor diode which has a negative resistance region when it is biased in the forward direction. A portion of the conduction current occurs as a result of quantum-mechanical tunneling of charge carriers through a narrow electrostatic dipole junction as a result of a high internal electric field. The article by L. Esaki in "Physical Review," volume 109, page 603, 1958, is a reference on this subject.

The forward current of a tunnel diode is characterized by a portion thereof being tunneling current which results from electrons which occupy states in the conduction band on the N side of the narrow junction penetrating the potential barrier thereof by means of quantum-mechanical tunneling to unoccupied states in the valence band on the P side. The tunneling current density is strongly dependent on the junction width and the doping density. The over-all current-voltage characteristic of the tunnel diode appears to be contributed to by: primary tunneling current; diffusion and drift currents, which are present in the normal P-N junction diode; excess current, which is considered to result from electrons tunneling across the junction potential barrier through intermediate impurity states in the forbidden band due to lattice defects; and field emission Zener current which is in a direction opposite to the primary tunneling current.

As a semiconductor junction becomes more degenerate, the primary tunneling probability may increase or decrease slightly. However, in either case the number of charge carriers increases rapidly as a function of degeneracy and the resulting current density increases. The article by P. S. Price and S. M. Radcliffe in the "IBM Journal of Research and Development," vol. 3, page 364, October 1959, is a reference in this regard.

Figure 1:
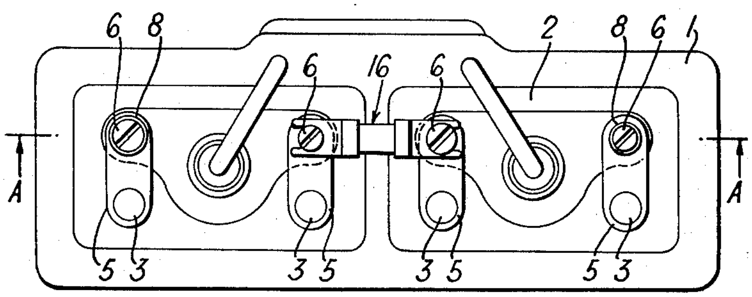

FIGURE 1*a* illustrates the tunnel diode as a circuit element 1. It has terminal 2 connected to a source of positive voltage and terminal 3 connected to a source of negative voltage. When so biased in the forward direction, the direction of current flow is illustrated by arrow 4.

FIGURE 1*b* is a typical forward current versus forward voltage curve for a tunnel diode. The curve has an essentially straight portion which passes through the origin 5 and quadrant 1 as region 6 and quadrant 3 as region 7. The curve peaks in quadrant 1 at point 8 and then has a negative resistance region 9 which bottoms at region 10. The curve then rises at region 11. The Zener current and primary tunneling current are of equal and opposite magnitude at origin 5. Region 7 corresponds to the condition of reverse junction voltage bias. The reverse current is primarily due to Zener current. Region 6 corresponds to the forward biased condition in which the maximum or peak of the primary tunneling current is being approached. Region 9 corresponds to the state of negative conductance resulting from the decrease in tunneling current with increase in applied forward voltage. Region 10 is the valley current region and is considered to result from the sum of the greatly diminished primary tunneling current, diffusion current minus drift current and excess current. Region 11 corresponds to normal diffusion current of a forward biased P-N junction.

The load-line 12 illustrates tunnel diode 1 switching circuit operation for a particular resistive load. Load-line 12 establishes stable operating points 13 and 14. If the current I is increased above the peak current 8, the tunnel diode 1 rapidly changes to the current condition at high voltage operating point 14.

The following are important considerations for understanding the nature of this invention:

In order to have maximum solubility of aluminum in germanium at the alloying temperature, the highest possible wetting temperature is indicated while for controlled dissolution of the germanium in the carrier system and minimum regrowth junction strain, the lowest possible wetting temperature is indicated. There is need for enough germanium to support the crystal lattice for the junction but there should not be so much germanium that the connection to the junction has high resistivity.

A discussion of some pertinent principles and phenomena follows to aid in understanding the description of the aspects of this invention hereinafter.

The article by F. A. Trumbore in "The Bell System Technical Journal," page 205, 1960, presents graphs of the solid solubilities of aluminum and tin in germanium versus temperature in degrees centigrade. Extrapolation of the aluminum graph to lower temperatures than shown in the article indicates that above the melting point of tin aluminum has an increasing solid solubility in germanium with increasing temperature up to approximately 700° C.

The text by M. Hansen, "Constitution of Binary Alloys," McGraw-Hill Book Co., Inc., 1958, on pages 135, 775 and 96, respectively, presents phase diagrams for the aluminum-tin, germanium-tin and aluminum-germanium alloy systems. The phase diagram for the aluminum-tin alloy system indicates that approximately 1% aluminum by weight will dissolve in liquidus tin near the tin melting point of 232° C. The phase diagram for the germanium-tin alloy system indicates that within the acceptacle temperature range for wetting of germanium by tin the slope of the germanium-tin liquidus is steep and a few percent germanium by weight will be dissolved therein. The phase diagram for the aluminum-germanium alloy system indicates that aluminum and germanium are soluble in each other upward from approximately 55% by weight of germanium over a temperature range from approximately 425° C. to 940° C., the melting point of germanium. It further indicates that a liquidus composition on the germanium-rich side of the eutectic point will produce a regrowth layer of germanium on the germanium host crystal.

For the practice of this invention, the aluminum and tin must both be liquid during the wetting of the germanium. This demands that the operation be in the liquidus region of the aluminum-tin alloy. The proportions of aluminum and tin must be judiciously selected so that both the aluminum and tin are liquidus and the temperature of the resultant alloy is not too high or too low relative to the amount of germanium to be dissolved therein in accordance with this invention.

It has been determined for the practice of the present invention that the rate of dissolution of germanium by aluminum-tin alloy is un-controllable at the maximum solid solubility temperature of approximately 700° C. for aluminum in germanium. Hence, to insure a planar interface between the germanium host and the aluminum-tin germanium alloy during wetting of the germanium host, a lower temperature must be utilized. At a temperature of approximately 300° C. an aluminum-tin alloy having approximately 1% aluminum by weight wets germanium. As the solid solubility of aluminum in germanium at this temperature is not appreciably different than at 700° C., nearly maximum degenerate P-type doping of the germanium by aluminum is feasible.

Although the maximum solid solubility of aluminum in germanium occurs at a temperature of approximately 700° C., at this temperature the change in the percentage dissolution of germanium in tin is extremely large for a small change in temperature. As the unit composition changes considerably per unit change in temperature, the liquidus-solidus interface is non-planar unless the temperature is controlled extremely accurately, which is extremely difficult. The resultant non-planar junction, even though narrow enough to give the tunnel diode characteristic, results in a diode which has disadvantageous electrical and mechanical properties.

However, at approximately 300° C., in accordance with this invention, there is a smaller amount of germanium dissolved in tin but sufficient enough to insure junction regrowth. Small changes in temperature do not cause large changes in the dissolution percentage of germanium. At approximately 300° C., the solid solubility of aluminum in germanium is adequate to insure degenerate P-type doping of the regrowth layer.

Since the germanium-tin liquidus curve has a steep slope at approximately 300° C., there is a minimum additional amount of germanium dissolved during the junction heating pulse which follows the wetting. This insures a minimum change in the planar liquid-solid interface between the aluminum-tin alloy and the N-type germanium host established during the wetting. The addition of aluminum to tin results in a steeper liquidus curve and the planar interface is even less affected during the heat pulse. Since aluminum is considerably more soluble in germanium at the highest temperature reached, approximately 500° C., the regrowth layer has a greater concentration of aluminum near the interface than it would have had were the junction formed at the wetting temperature.

In the practice of this invention a planar liquidus-solidus interface is established during the dissolution of solidus germanium by the aluminum-tin liquidus. Thereafter, a minimum dissolution of germanium occurs during a pulse-like high heating cycle of the interface. This insures a planar junction upon recrystallization of the germanium achieved on rapid freezing of the liquidus. It is easier to control the wetting of germanium with aluminum-tin liquidus than with tin liquidus. Controllable wetting and a planar junction result from control of the composition of the aluminum-tin alloy and of the dissolution temperature.

During the junction formation process, in accordance with this invention, the temperature of the germanium host surface is raised slowly until sufficient wetting of the germanium surface is obtained. Alloying is carried on for several seconds at this temperature to obtain dissolution of germanium host in the liquidus aluminum-tin alloy. This insures planar wetting of the alloy on the germanium before the application of the heat pulse to the interface. The maximum allowable temperature for the heat pulse is determined experimentally. Theoretically, it can be determined by a compromise between the temperature on the extrapolated ternary phase composition curve for germanium, aluminum and tin above which germanium rapidly dissolves, and the temperature of the maximum solid solubility of aluminum in germanium. Thereafter, the liquidus alloy is cooled to produce a narrow regrowth layer of aluminum in germanium at the interface. This cooling is important for obtaining large tunneling current densities since effective junction widths should be as narrow as possible to obtain a high tunneling probability. Large grain germanium crystal sections are desirably chosen to wet since wetting at grain boundaries by the aluminum-tin carrier system produces poor quality tunnel diodes. The 1:1:1 crystallographic plane is the high binding energy plane in germanium and is the preferable surface for controllable wetting.

In the practice of an aspect of this invention, germanium is degenerately doped with an N-type dopant by a conventional technique. The N-type dopant, illustratively, may be antimony, arsenic or phosphorus, used either singly or collectively. Wafers thereof having 10 to 20 mil thickness are cut into approximately 40 x 40 mil squares. The germanium surface for alloying with the aluminum-tin alloy is electrolytically etched with a potassium hydroxide solution. Such a surface permits ready and controllable wetting by the aluminum-tin alloy.

The germanium wafer is soldered to a metallic strip, preferably nickel, with a soft, neutral, high conductivity solder such as tin or lead to insure good ohmic contact and a connection free from mechanical strains. Strains cause the tunnel diode to have adverse electrical and mechanical characteristics. The soldering is accomplished by placing the nickel strip on a tungsten heating strip and heating the tungsten heating strip in the presence of an inert gas such as nitrogen. Heat is obtained by passing electric current through the tungsten heating strip.

A small disc or chunk of the aluminum-tin alloy is then placed on the top surface of the N-type germanium host crystal and the temperature increased from ambient until the alloy becomes liquidus and spheroidal. An inert atmosphere is maintained in the environment of the alloying to prevent oxidation.

The temperature of the alloying liquidus-solidus interface is maintained constant and wetting proceeds for a period of time so that a small percentage of the germanium is dissolved by the liquidus aluminum-tin alloy. The interface is then rapidly heated by a current pulse in the tungsten heating strip and is then rapidly cooled. The P-N junction is formed during the freezing of the liquidus. After the entire system is cooled to ambient temperature, the solidified tin-rich alloy is utilized as an ohmic contact for the regrown P-type germanium layer.

Figure 2:
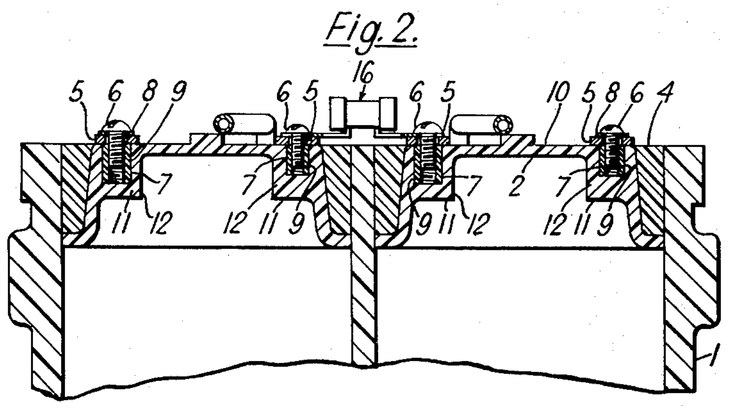
FIGURE 2 is a diagram which illustrates the spherical nature of the aluminum-tin alloy and its relationship to germanium host crystal when wetting thereof begins at the wetting temperature.
Figure 3:
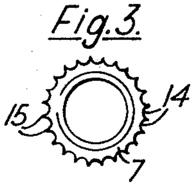
FIGURE 3 is a schematic diagram illustrating the junction established in the germanium host and the equipment utilized during the heating and cooling cycle for alloying aluminum with germanium.

FIGURES 2 and 3 illustrate the practice of this invention.

FIGURE 2 illustrates the aluminum-tin alloy carrier system and the N-type germanium host crystal when the alloy has become spherical and dissolution of the host has started. The alloy piece 15 is of approximate composition 99% tin and 1% aluminum by weight. It is shown and described as a sphere for illustrative purpose only. As soon as the alloy piece 15 melts, it assumes a spheroidal shape and wets the host 16 on circular area 17. Although host 16 is shown as a rectangular parallelepiped, it can be any shape. Germanium host 16 is degenerately doped with N-type dopant by conventional techniques. Illustratively, the dopant may be antimony, arsenic or phosphorus, used singly or collectively.

FIGURE 3 is a schematic diagram of the experimental arrangement used for the practice of this invention. It includes alloying section 18 and electrical power source 19. An aluminum-tin alloy piece 20 and germanium host 22 are separated by the planar junction 24 established by the process in accordance with this invention. In a manner not illustrated, the resultant junction is electrolytically etched by conventional technique to enhance the tunnel diode characteristics. Before the alloy piece 20 is paced on the host 22, the latter is soldered to nickel strip 25 by solder layer 26. Nickel strip 25 rests on tungsten heating strip 28.

Electrical power source 19 includes auto-transformers 29 and 30 with windings 32 and 34, respectively. Auto-transformer winding 32 is connected via switch 36 to power line input terminals 38 and 40. Auto-transformer winding 34 is connected via switch 42 to powerline input terminals 38 and 40. Auto-transformer 29 is connected to step-down transformer 44 which has input winding 46, core 47 and output winding 48. Auto-transformer 30 is connected to step-down transformer 50. Step-down transformer 50 has input winding 48, core 53 and output winding 54. Output windings 52 and 54 are connected by conductor 56. The additional terminal of each transformer winding 48 and 54 is connected by conductors 57 and 58 to the respective end of tungsten heating strip 28 via opening 60 in base 59.

Tungsten heating strip 28 is mounted on base 59 by insulators 61 and 62. A glass chamber 70 rests on base 60 in slot 71 therein and with base 59 encloses heating strip 28 and the materials resting thereon. Inert gas tube 72 enters chamber 70 through opening 74 in base 59. Inert gas tube 72 is connected to inert gas source 76 via valve 78. Valve 78 is set to permit a small positive pressure of the inert gas, e.g., nitrogen, at orifice 73. The gas is permitted to flow for an interval prior to the heating cycle to remove most of the air from chamber 70 via opening 60. With the air removed, the alloying process can proceed without oxidation of the materials.

Switch 36 is closed and the heating cycle is initiated by slowly increasing the power available to the tungsten heating strip 28 from auto-transformer 29. The alloy piece 20 becomes spheroidal as soon as it melts. The temperature to which the alloy piece 20 is raised is such that sufficient wetting of the germanium host 22 occurs. Heating is continued at a constant rate for several seconds to obtain satisfactory dissolution of germanium host 22 by the aluminum-tin alloy 20. A rapid heating pulse is then applied to tungsten heating strip 28 by closing switch 42. The rapid heating pulse is terminated by opening switches 36 and 42 and the solidus-liquidus interface is rapidly cooled.

The cooling of the interface can be accomplished by establishing a heat sink, not shown, in contact with the tungsten heating strip 28. The cooling technique illustrated provides a cold inert gas in the vicinity of the interface. Cooling gas pipe 80 enters chamber 70 through opening 82 in base 59. Liquid nitrogen source 84 provides the cold nitrogen gas via valve 86 and orifice 88. The rapid freezing of the liquidus causes a narrow tunnel diode junction to form in the regrown layer of the germanium crystal.

Figure 4:
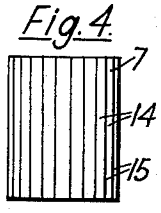
FIGURE 4 is a temperature versus time curve illustrating the heating and cooling cycle utilized for the alloying of aluminum with germanium.

The heating and cooling cycle in accordance with this invention is now described with reference to FIGURE 4 which presents a graph 89 of the temperature of the interface versus time. An initial heating period is obtained by closing switch 36 to bring the aluminum-tin alloy 20 to the liquidus state to obtain sufficient wetting of the host germanium host crystal 22. The wetting is continued for approximately 10 seconds, portions 90 and 94 of graph 89, to obtain dissolution of germanium in the liquidus. Then, a rapid heating pulse 96 of approximately 1 second duration is provided to the interface by closing switch 42. The interface is rapidly cooled immediately thereafter as indicated by portion 98 of graph 89. The more rapid the cooling, the faster the recrystallization of germanium takes place at the interface, and the narrower the resultant junction. Practically, the rate of interface cooling must not be so great that undesirable junction mechanical strains occur. The proper rate is readily determined by experiment through measurement of the resultant tunnel diode operational characteristics.

Figure 5:
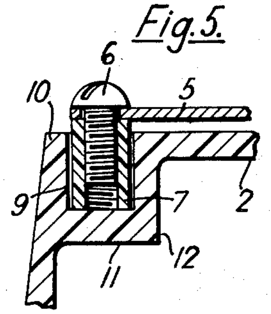
FIGURE 5 is an illustrative phase diagram suitable for explaining the wetting of germanium by the aluminum-tin alloy.
Figure 5:
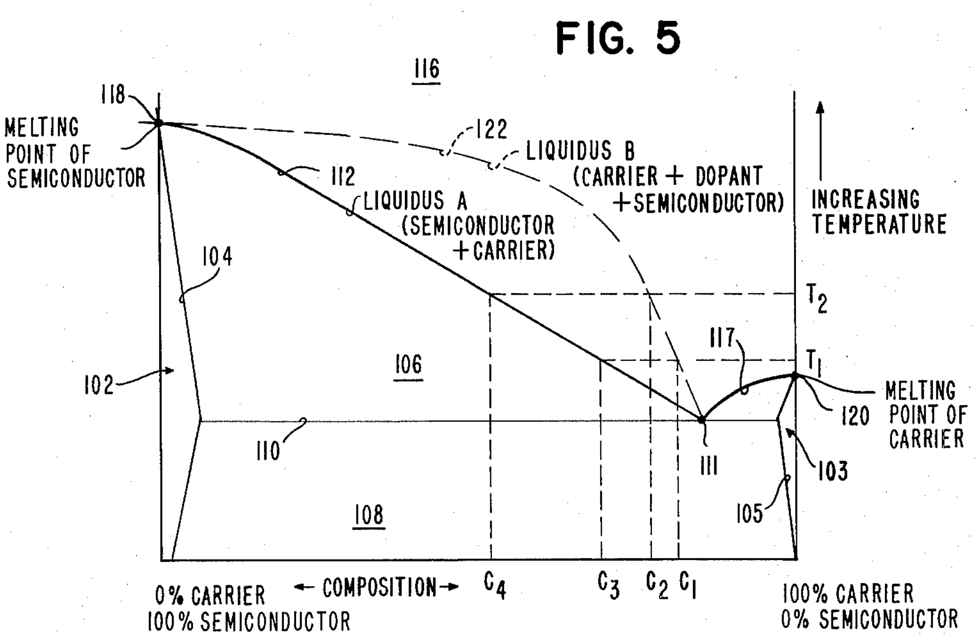

FIGURE 5 is a binary phase diagram useful for explaining the effect of the carrier-tin on the dissolution of germanium and the change in the liquids curve by the addition of liquidus aluminum within the carrier. Temperature and percent composition: are the vertical and horizontal axes, respectively. There are 0% carrier and 100% semiconductor on the extreme left. There are 100% carrier and 0% semiconductor on the extreme right. The liquidus-B curve illustrates the effect of addition of aluminum to tin. However, the rest of the phase diagram does not reflect the addition of aluminum. A ternary phase diagram would be required for this purpose.

First, the phase diagram for the carrier-semiconductor alloy system will be described. The solid solution area 102 of carrier in semiconductor is defined by the solidus curve 104. The solid solution of semiconductor in carrier is area 103 defined by solidus curve 105. The solid-carrier plus liquid-semiconductor region is area 106 where a composition of two phases is present. It lies above eutectic line 110 and below liquidus-A curve 112. The solid-carrier plus solid-semiconductor is area 108. The eutectic line 110 is drawn from the solidus line 104 to the solidus line 105. The eutectic point 111 is the lowest temperature point at which any liquidus composition between the carrier and the semiconductor will recrystallize. Both the carrier and semiconductor are liquidus above the liquidus curves 112 and 117. Points 118 and 120 indicate the melting points of the semiconductor and carrier, respectively.

With the liquidus-B curve 122 for carrier plus dopant plus semiconductor, there is a change in the amount of semiconductor dissolved from C1 to C2. With the liquidus-A curve 112 for carrier plus host, there is a change in the semiconductor dissolved from C3 to C4. The former is a significantly smaller change. Accordingly, the composition of the liquid and the amount of semiconductor dissolved by the carrier due to a change in temperature is more readily controllable if the liquidus B is used.

Figure 6:
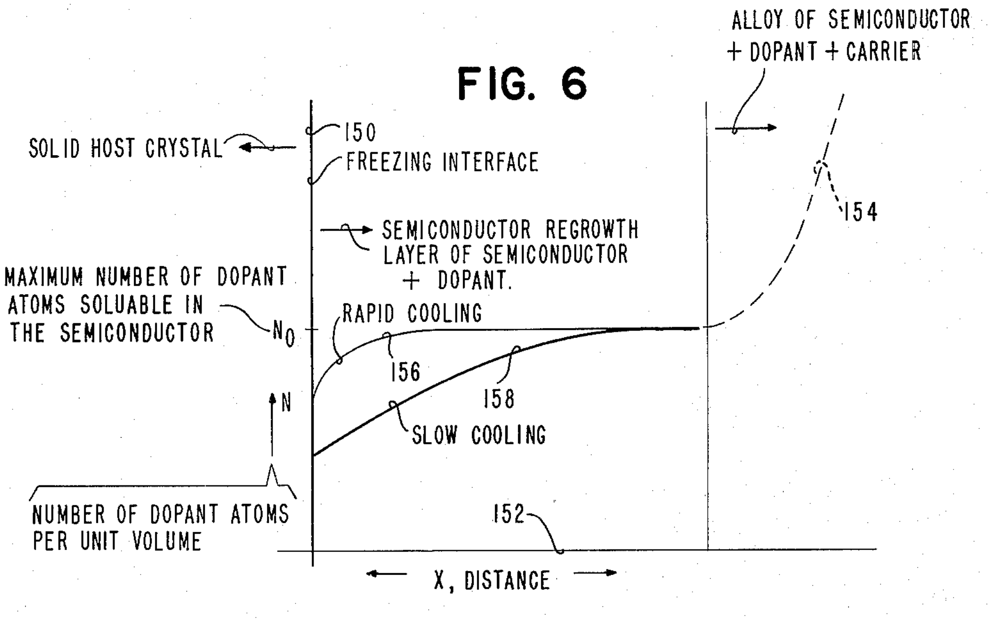
FIGURE 6 is an illustrative profile of the dopant concentration within the regrowth germanium layer as a function of distance measured from the interface, showing the difference between two cooling rates of the liquidus-solidus interface.

FIGURE 6 represents illustrative graphs of the number of dopant atoms per unit volume N versus distance X from the freezing interface for different non-equilibrium cooling rates. The figure demonstrates that with an increase in cooling rate, the dopant concentration is larger near the interface. A reference in this regard is the book by W. G. Pfann, "Zone Melting," John Wiley & Sons, Inc., 1958, page 17.

The freezing interface is vertical axis 150. The distance in the regrowth layer measured from the freezing interface is the horizontal axis 152. The dotted curve 154 shows the number of dopant atoms per unit volume for the alloy of semiconductor plus dopant plus carrier with distance from the freezing interface. Curve 156 shows the number of dopant atoms per unit volume for the alloy of semiconductor plus dopant in the semiconductor regrowth region for a relatively rapid cooling of the freezing interface. Curve 156 indicates that a narrow junction is obtained when there is a rapid cooling rate at the interface. Curve 158 shows the number of atoms per unit volume for the alloy of semiconductor plus dopant in the semiconductor regrowth region for a relatively slow cooling of the freezing interface. Curve 158 indicates that a wider junction is obtained with a slower cooling rate.

While the invention has been particularly described and illustrated, it will be understood by those skilled in the art that various changes in form and details may be made without departing from the spirit and scope of the invention.

What is claimed is:

1. A tunnel diode, comprising:
a degenerately doped N-type germanium body;
an aluminum-tin alloy electrode including approximately 1% of aluminum by weight; and
a junction region connecting the body and electrode consisting of substantially pure aluminum with germanium in dissolution.

2. A process for making a tunnel diode, comprising:
degenerately doping a germanium body;
soldering the body to a heat conducting base;
disposing an aluminum-tin alloy member restingly on the body;
applying heat to the base until the aluminum-tin member wets the opposed portions of the germanium body and full dissolution of germanium in the wetting member is obtained;
applying a pulse of heat energy to the base for raising the temperature of the body and member to 500° C. for one (1) second;
directing a coolant material onto the body and member for rapidly bringing the same to ambient temperature.

3. A process for making a tunnel diode as in claim 2, in which there is further included the step of
disposing the body, member and heat conducting base in a chamber containing an inert gas during the heating and cooling steps.

4. A process for making a planar regrowth junction tunnel diode wherein aluminum is utilized as the acceptor impurity, comprising the steps of:
degenerately doping a germanium body with a donor impurity,
placing the germanium body in contact with an aluminum-tin alloy member containing approximately 1% of aluminum by weight,
heating the germanium body until the aluminum-tin alloy wets the surface of the germanium body, and full dissolution of the germanium in the alloy occurs in the interface region,
applying a short pulse of heat energy to the germanium body so as to raise the temperature of the interface region to a temperature sufficiently high to produce an increased concentration of aluminum in the interface region, but not so high as to produce the non-planar dissolution of germanium in the tin,
rapidly cooling the germanium body and aluminum-tin alloy member to ambient temperature.

5. A process for making a tunnel diode as in claim 4, wherein the pulse of heat energy is sufficient to raise the temperature of the interface region to 500° C. for a period of one second.

6. A process for making a planar regrowth junction tunnel diode wherein aluminum is utilized as the acceptor impurity, comprising the steps of:
degenerately doping a germanium body with a donor impurity,
placing the germanium body in contact with an alloy member containing 1% aluminum and 99% tin by weight,
heating the body and the member to 300° C. for a period of approximately five seconds in order to obtain planar wetting of the germanium body by the alloy with full dissolution of the germanium in the alloy,
heating the body and the member to a higher temperature at a rate of approximately 400° C. per second to a maximum temperature of approximately 500° C.,
immediately lowering the temperature of the body and the member at a rate of approximately 400° C. per second to ambient temperature.

(References on following page)

References Cited by the Examiner

UNITED STATES PATENTS

| | | | |
|---|---|---|---|
| 2,692,839 | 10/54 | Christensen | 148—1.5 |
| 2,859,141 | 11/58 | Wolsky | 148—1.5 |
| 2,932,594 | 4/60 | Mueller | 148—1.5 |
| 3,001,894 | 9/61 | Becker et al. | 148—1.5 |
| 3,013,910 | 12/61 | Wolsky | 148—1.5 |
| 3,027,501 | 3/62 | Pearson | 148—1.5 |
| 3,033,714 | 5/62 | Ezaki et al. | 148—33 |
| 3,041,508 | 6/62 | Joachim Henkel et al. | |
| 3,079,512 | 2/63 | Rutz | 148—33 |

OTHER REFERENCES

Hansen, "Constitution of Binary Alloys," McGraw-Hill Book Company, Inc., New York, 1958, pages 764 and 775.

HYLAND BIZOT, *Primary Examiner.*

OSCAR R. VERTIZ, DAVID L. RECK, *Examiners.*